United States Patent
Li

(10) Patent No.: US 10,048,412 B2
(45) Date of Patent: Aug. 14, 2018

(54) QUANTUM DOT COLOR FILTER SUBSTRATE AND MANUFACTURING METHOD THEREOF

(71) Applicant: Shenzhen China Star Optoelectronics Technology Co., Ltd., Shenzhen (CN)

(72) Inventor: Dongze Li, Shenzhen (CN)

(73) Assignee: SEHNZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 420 days.

(21) Appl. No.: 14/915,890

(22) PCT Filed: Dec. 28, 2015

(86) PCT No.: PCT/CN2015/099260
§ 371 (c)(1),
(2) Date: Mar. 1, 2016

(87) PCT Pub. No.: WO2017/080077
PCT Pub. Date: May 18, 2017

(65) Prior Publication Data
US 2017/0254933 A1    Sep. 7, 2017

(30) Foreign Application Priority Data
Nov. 13, 2015 (CN) .......................... 2015 1 0779371

(51) Int. Cl.
*G02B 5/20* (2006.01)
*H01L 27/32* (2006.01)
(Continued)

(52) U.S. Cl.
CPC ............... *G02B 5/20* (2013.01); *G02B 5/201* (2013.01); *G02F 1/133514* (2013.01);
(Continued)

(58) Field of Classification Search
CPC .......... G02B 5/20; G02B 5/201; G02B 5/206; G03F 7/0007; H01L 27/322;
(Continued)

(56) References Cited

U.S. PATENT DOCUMENTS

| | | | | |
|---|---|---|---|---|
| 2004/0241560 A1* | 12/2004 | Kawaguchi | ............ | G02B 5/201 430/7 |
| 2005/0084775 A1* | 4/2005 | Kawaguchi | ............ | G02B 5/201 430/7 |
| 2005/0089772 A1* | 4/2005 | Kawaguchi | ............ | G02B 5/201 430/7 |

* cited by examiner

*Primary Examiner* — John A McPherson
(74) *Attorney, Agent, or Firm* — Leong C. Lei

(57) ABSTRACT

The invention discloses a QD CF substrate and manufacturing method thereof. The manufacturing method uses high power UV light irradiation on the QD material in the QD gel for prolonged period of time to perform selective quenching to obtain a selectively quenched QD layer, i.e., patterning the QD layer without etching process, achieve simplifying the QD CF substrate manufacturing process and reduce production cost. The QD CF substrate uses selectively quenched QD layer obtain by UV light irradiation technology to achieve improve the color gamut of display as well as simplifying manufacturing process. Moreover, the QD layer comprises no blue QD material, but uses blue backlight and organic transparent photo-resist layer to improve light utilization efficiency as well as reduce material cost.

11 Claims, 2 Drawing Sheets

(51) Int. Cl.
*H01L 33/50* (2010.01)
*G02F 1/1335* (2006.01)
*G03F 7/00* (2006.01)
*H01L 33/06* (2010.01)

(52) U.S. Cl.
CPC ...... *G02F 1/133621* (2013.01); *G03F 7/0007* (2013.01); *H01L 27/322* (2013.01); *H01L 33/502* (2013.01); *H01L 33/507* (2013.01); G02F 2001/133614 (2013.01); G02F 2202/36 (2013.01); *H01L 33/06* (2013.01)

(58) Field of Classification Search
CPC ..... H01L 33/502; H01L 33/507; H01L 33/06; G02F 1/133514; G02F 1/133516; G02F 2203/36
USPC .............................................. 430/7; 349/106
See application file for complete search history.

QUANTUM DOT COLOR FILTER SUBSTRATE AND MANUFACTURING METHOD THEREOF

BACKGROUND OF THE INVENTION

1. Field of the Invention

The present invention relates to the field of display, and in particular to a quantum dot (QD) color filter (CF) substrate and manufacturing method thereof.

2. The Related Arts

As technology continues to develop, the users demand higher display quality. The liquid crystal display (LCD) TV currently available can show a gamut between 68%-72% NTSC (National Television Standards Committee), and therefore cannot provide high quality color display. To improve the color gamut of LCD TV, the high color gamut backlight technology is becoming the focus of research in the industry.

When the semiconductor material decreases the size to a certain critical size (1-20 nm), the carrier wave property becomes significant, and the movement will be limited to result in an increase in the kinetic energy. The corresponding electron structure changes from a continuous energy level structure to a quasi-split discontinuity structure, a phenomenon known as quantum size effect. The more common semiconductor quantum dot nano-particles, i.e., quantum dots (QD) are the Group II-VI, II-V and Group IV-VI Group QD. These groups of QD observe the quantum size effect, and the property changes regularly with the size, for example, the absorption and emission wavelength change as the size changes. Therefore, the semiconductor QD plays an important role in the applications of lighting, displays, lasers and biological fluorescent markings.

With the advantages of QD material properties, such as, having a concentrated emission spectrum, high color purity, and the luminescent color adjustable by size, structure or composition of the QD material applied to the display, the display can effectively improve the color gamut and color reproduction capability. The currently available QD television is the best embodiment of the material applied to the display. However, the known technology is mainly focused on the QD film or QD tube made by mixing and sealing the light-emitting band R (red) G (green) B (blue) quantum dots in plastic film or glass, and placing the QD film or QD tube between the backlight and display system, using the conventional white backlight to excite to achieve the rich color gamut. The above technology is currently more mature, but to a certain extent, there are still problems to be improved, for example, regardless of the structure used (i.e., QD film or QD tube), the amount of QD material is relatively large, and the use of white backlight to excite the mixed QD will cause a decline in light utilization efficiency.

SUMMARY OF THE INVENTION

The object of the present invention is to provide a manufacturing method for a QD CF substrate, which uses high power UV irradiation on the QD material in the QD gel for a prolonged period to perform selective quenching to obtain high color gamut, as well as simplifying the QD CF substrate manufacturing process and reducing production costs.

Another object of the present invention is to provide a QD CF substrate, which can meet the demands on high color gamut in display, as well as simplifying the QD CF substrate manufacturing process and reducing production costs.

To achieve the above object, the present invention provides a manufacturing method for QD CF substrate, which comprises:

Step 1: providing a substrate, the substrate comprising: red sub-pixel areas, green sub-pixel areas, and blue sub-pixel areas;

Step 2: forming a patterned red color-resist layer and a green color-resist layer, and an organic transparent color-resist layer respectively on the corresponding red sub-pixel areas, green sub-pixel areas, and blue sub-pixel areas of the substrate to obtain a color filter (CF) layer comprising a red color-resist layer, a green color-resist layer and an organic transparent layer;

Step 3: coating a layer of QD gel on the CF substrate, and curing the QD gel;

the QD gel being a heat-curing gel comprising therein a red QD material and a green QD material;

Step 4: providing a mask, the mask comprising an opaque portion corresponding to the red and green sub-pixel areas, and a transparent portion corresponding to the blue sub-pixel areas; using UV light to perform irradiation on the portion of the mask corresponding to blue sub-pixel areas for 3-40 hours, so that the irreversible fluorescence quenching occurring for the QD material in the QD gel located on the blue sub-pixel areas under long time UV light irradiation, and the QD material in the QD gel located on red sub-pixel areas and green sub-pixel areas not affected by the UV light due to shielding from the mask, thus, obtaining a selectively quenched QD layer; so as to obtain a QD CF film comprising the substrate, the CF film, and the QD layer; the QD layer comprising: a first QD layer located on the red sub-pixel areas and green sub-pixel areas, and a second QD layer located on the blue sub-pixel areas;

the red QD material and the green QD material in the first QD layer emitting red and green light respectively under the excitement by blue light; and the QD material in the second QD layer not emitting light when excited.

In Step 3, the coating thickness of the QD gel on the CF layer is 0.5-20 um.

The QD material in the QD gel is one or more of the II-VI group QD material and I-III-VI group QD material.

The QD material in the QD gel is one or more of $ZnCdSe_2$, $CdSe$, $CdTe$, $CuInS_2$, and $ZnCuInS_3$.

The QD CF substrate is used to a display using blue backlight.

The present invention also provides a QD CF substrate, which comprises: a substrate, a CF layer disposed on the substrate, and a QD layer disposed on the CF layer;

the substrate comprising: red sub-pixel areas, green sub-pixel areas, and blue sub-pixel areas; the color filter (CF) layer comprising a red color-resist layer, a green color-resist layer and an organic transparent layer disposed respectively on the corresponding red sub-pixel areas, green sub-pixel areas, and blue sub-pixel areas; the QD layer comprising:

a first QD layer located on the red sub-pixel areas and green sub-pixel areas, and a second QD layer located on the blue sub-pixel areas; the QD layer being formed by QD gel, and the QD gel being obtained by mixing and curing a gel with a red QD material and a green QD material; the red QD material and the green QD material in the first QD layer emitting red and green light respectively under the excitement by blue light; irreversible fluorescence quenching occurring for the QD material in the second QD layer under long time UV light irradiation for 3-40 hours, and the QD material in the second QD layer not emitting light when excited;

the QD CF substrate is used to a display using blue backlight.

The display is an LCD, an OLED display, or a QLED display.

The thickness of the QD layer is 0.5-20 um.

The QD material in the QD gel is one or more of the II-VI group QD material and I-III-VI group QD material.

The QD material in the QD gel is one or more of $ZnCdSe_2$, CdSe, CdTe, $CuInS_2$, and $ZnCuInS_3$.

The present invention also provides a QD CF substrate, which comprises: a substrate, a CF layer disposed on the substrate, and a QD layer disposed on the CF layer;

the substrate comprising: red sub-pixel areas, green sub-pixel areas, and blue sub-pixel areas; the color filter (CF) layer comprising a red color-resist layer, a green color-resist layer and an organic transparent layer disposed respectively on the corresponding red sub-pixel areas, green sub-pixel areas, and blue sub-pixel areas;

the QD layer comprising: a first QD layer located on the red sub-pixel areas and green sub-pixel areas, and a second QD layer located on the blue sub-pixel areas; the QD layer being formed by QD gel, and the QD gel being obtained by mixing and curing a gel with a red QD material and a green QD material; the red QD material and the green QD material in the first QD layer emitting red and green light respectively under the excitement by blue light; irreversible fluorescence quenching occurring for the QD material in the second QD layer under long time UV light irradiation for 3-40 hours, and the QD material in the second QD layer not emitting light when excited;

the QD CF substrate is used to a display using blue backlight;

wherein the display is an LCD, an OLED display, or a QLED display;

wherein the thickness of the QD layer is 0.5-20 um;

wherein the QD material in the QD gel is one or more of the II-VI group QD material and I-III-VI group QD material;

wherein the QD material in the QD gel is one or more of $ZnCdSe_2$, CdSe, CdTe, $CuInS_2$, and $ZnCuInS_3$.

Compared to the known techniques, the present invention provides the following advantages: the present invention provides a QD CF substrate and manufacturing method thereof. The manufacturing method uses high power UV light irradiation on the QD material in the QD gel for prolonged period of time to perform selective quenching to obtain a selectively quenched QD layer, i.e., patterning the QD layer without etching process, achieve simplifying the QD CF substrate manufacturing process and reduce production cost. The QD CF substrate uses selectively quenched QD layer obtain by UV light irradiation technology to achieve improve the color gamut of display as well as simplifying manufacturing process. Moreover, the QD layer comprises no blue QD material, but uses blue backlight and organic transparent photo-resist layer to improve light utilization efficiency as well as reduce material cost.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
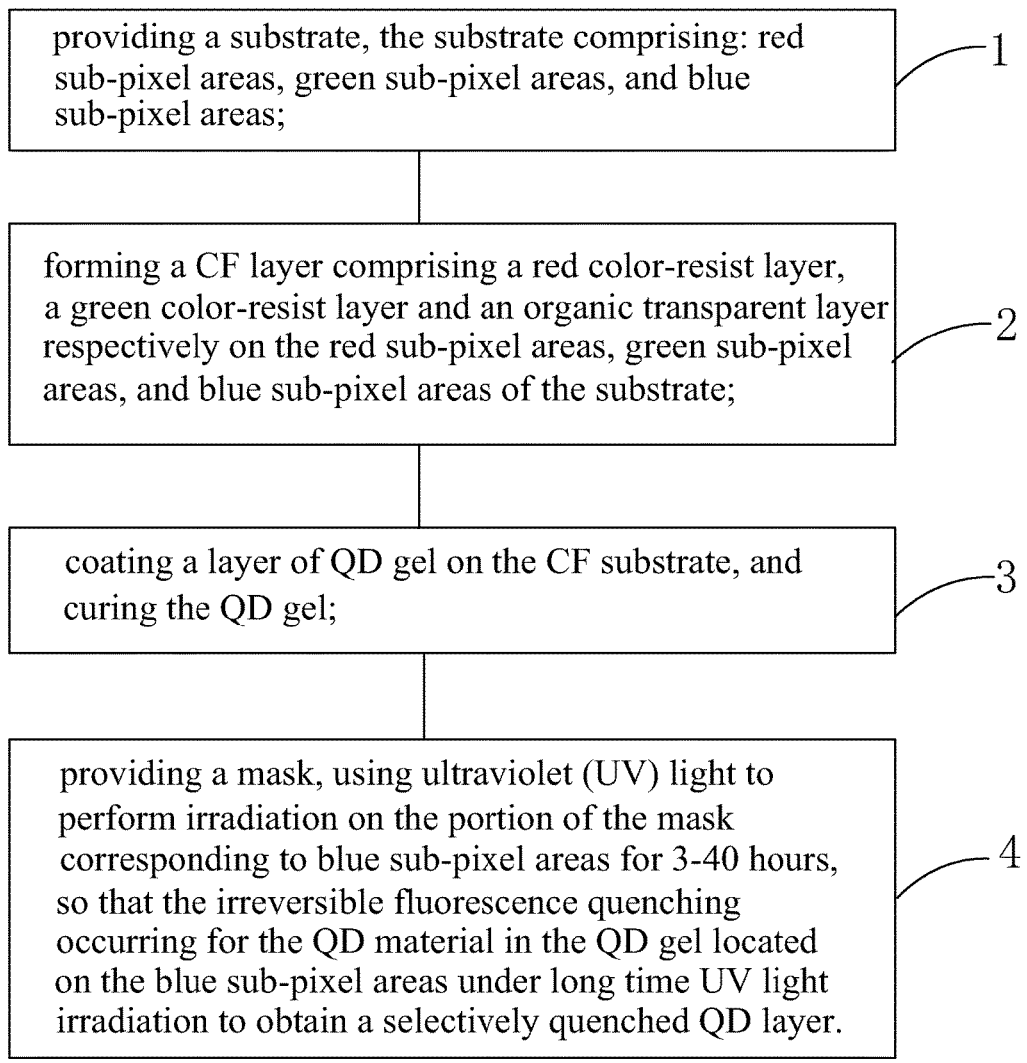
FIG. 1 is a schematic view showing the flowchart of the manufacturing method for QD CF substrate provided by an embodiment of the present invention.

Refer to FIG. 1. The present invention provides a manufacturing method for QD CF substrate, which comprises:

Step 1: providing a substrate 10, the substrate 10 comprising: red sub-pixel areas, green sub-pixel areas, and blue sub-pixel areas.

Step 2: forming a patterned red color-resist layer 21 and a green color-resist layer 22, and an organic transparent color-resist layer 23 respectively on the corresponding red sub-pixel areas, green sub-pixel areas, and blue sub-pixel areas of the substrate 10 to obtain a CF layer 20 comprising a red color-resist layer 21, a green color-resist layer 22 and an organic transparent layer 23.

Step 3: coating a layer of QD gel with thickness of 0.5-20 um on the CF substrate 20, and curing the QD gel.

Specifically, the QD gel is a heat-curing gel comprising therein a red QD material and a green QD material. Specifically, the QD material in the QD gel is one or more of the II-VI group QD material and I-III-VI group QD material; preferably, the QD material in the QD gel is one or more of $ZnCdSe_2$, CdSe, CdTe, $CuInS_2$, and $ZnCuInS_3$.

Figure 2:
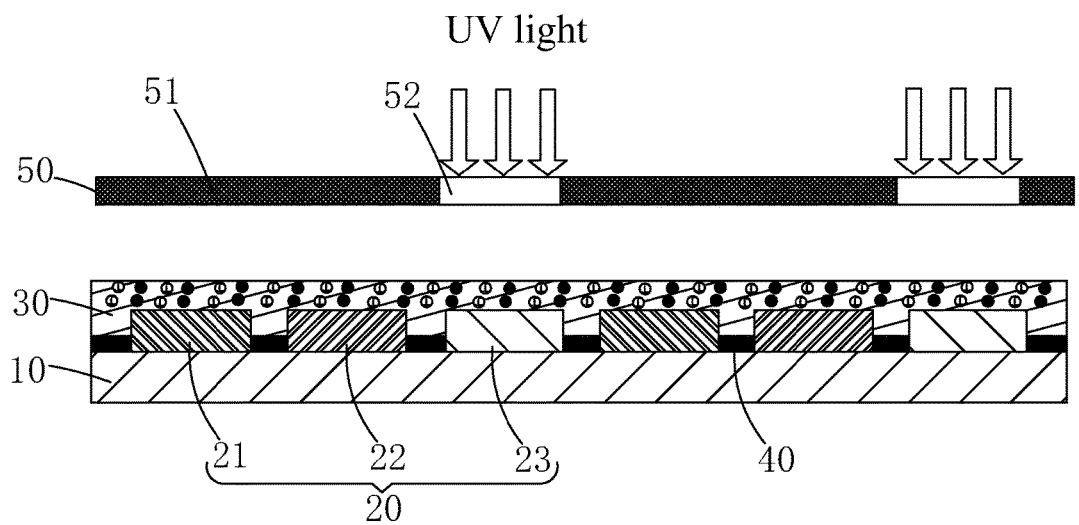
FIG. 2 is a cross-sectional view showing Step 4 of the manufacturing method for QD CF substrate provided by an embodiment of the present invention.

Step 4: as shown in FIG. 2, providing a mask 50, the mask 50 comprising an opaque portion 51 corresponding to the red and green sub-pixel areas, and a transparent portion 52 corresponding to the blue sub-pixel areas; using high power UV light to perform irradiation on the portion of the mask 50 corresponding to blue sub-pixel areas for 3-40 hours, so that the irreversible fluorescence quenching occurring for the QD material in the QD gel located on the blue sub-pixel areas under long time UV light irradiation, and the QD material in the QD gel located on red sub-pixel areas and green sub-pixel areas not affected by the UV light due to shielding from the mask, thus, obtaining a selectively quenched QD layer 30; so as to obtain a QD CF film comprising the substrate 10, the CF film 20, and the QD layer 30; the QD layer comprising: a first QD layer 31 located on the red sub-pixel areas and green sub-pixel areas, and a second QD layer 32 located on the blue sub-pixel areas; the red QD material and the green QD material in the first QD layer 31 emitting red and green light respectively under the excitement by blue light; and the QD material in the second QD layer 32 not emitting light when excited.

When the QD CF substrate is applied to a display using a blue backlight for displaying, the first QD layer 31 emits a mixed red and green light, which is filtered respectively by the red color-resist layer 21 and green color-resist layer to become red light and green light; the blue backlight passes directly through the second QD layer 32 and the organic transparent color-resist layer 23 to show blue color, so as to achieve color display as well as improve color gamut index of the display. Also, and the QD layer 30 does not comprise a blue QD material, but uses the blue backlight and the organic transparent color-resist layer to improve the light utilization and reduce material costs.

Specifically, in Step 4, the fluorescence quenching effect on the QD material is directly related to the power of the UV light and the period of time of irradiation. After Step 4, the QD CF substrate will not experience fluorescence quenching occurrence under a brief UV light irradiation in subsequent processes.

The selective quenching mechanism of the present invention is to use a high power UV to irradiate fixedly at the QD gel for an extended period of time with the assistance of a mask. When the QD material is under the high power UV irradiation for prolonged time, the photo-generated electrons and holes are uninterruptedly excited to separate. Under normal circumstances, the excited electrons will return to the valence band in a non-radiative transition form to recombine with holes, and emit fluorescence. But prolonged high-power high-energy excitation light source will change the process. The photo-generated exciton recombination path becomes difficult, and inevitably will be converted into other forms of energy. The excited electrons will pass through irreversible interstitial and other energy transfer, which would cause an irreversible damage to the fluorescent property of QD. After prolonged UV excitation, the QD material will experience fluorescence quenching occurrence.

The manufacturing method for QD CF substrate of the present invention uses a simple heat-curing adhesive composition to disperse QD materials to reduce the interference caused by the surrounding chemical environment on the QD material emission. By high power UV light irradiation for prolong time on QD material in the QD gel to perform selective quenching , the selectively quenched QD layer is obtained and the patterned QD layer is achieved without etching process, which simplifies the manufacturing process of QD CF substrate and reduces production costs.

Figure 3:
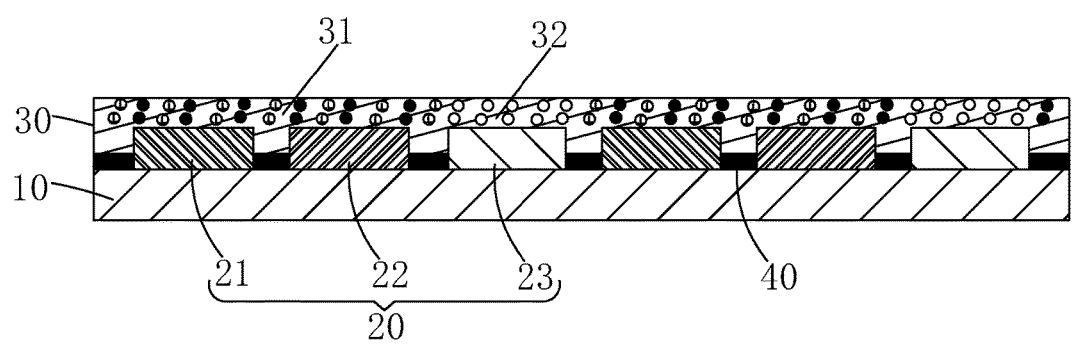
FIG. 3 is a cross-sectional view showing the QD CF substrate provided by an embodiment of the present invention.

As shown in FIG. 3, the present invention also provides a QD CF substrate, which comprises: a substrate 10, a CF layer 20 disposed on the substrate 10, and a QD layer 30 disposed on the CF layer 20.

The substrate 10 comprises: red sub-pixel areas, green sub-pixel areas, and blue sub-pixel areas; the CF 20 layer comprises a red color-resist layer 21, a green color-resist layer 22 and an organic transparent layer 23 disposed respectively on the corresponding red sub-pixel areas, green sub-pixel areas, and blue sub-pixel areas.

The QD layer 30 comprises: a first QD layer 31 located on the red sub-pixel areas and green sub-pixel areas, and a second QD layer 32 located on the blue sub-pixel areas. The QD layer 30 is formed by QD gel, and the QD gel is obtained by mixing and curing a gel with a red QD material and a green QD material. The red QD material and the green QD material in the first QD layer 31 emits red and green light respectively under the excitement by blue light; irreversible fluorescence quenching occurring for the QD material in the second QD layer 32 under long time UV light irradiation for 3-40 hours, and the QD material in the second QD layer 32 not emitting light when excited.

The QD CF substrate is used to a display using blue backlight; specifically, the display is an LCD, an OLED display, or a QLED display.

Specifically, the thickness of the QD layer 30 is 0.5-20 um; wherein the red QD material in the first QD layer 31 emit a red light with wavelength of 630-690 nm when excited by blue backlight, the green QD material in the first QD layer 31 emit a green light with wavelength of 500-560 nm when excited by blue backlight, and the QD material in the second QD layer 32 is a fluorescence quenched QD material, and therefore does not emit light when excited by backlight. When the QD CF substrate is applied to a display using a blue backlight for displaying, the first QD layer 31 emits a mixed red and green light, which is filtered respectively by the red color-resist layer 21 and green color-resist layer to become red light and green light; the blue backlight passes directly through the second QD layer 32 and the organic transparent color-resist layer 23 to show blue color, so as to achieve color display as well as improve color gamut index of the display. Also, and the QD layer 30 does not comprise a blue QD material, but uses the blue backlight and the organic transparent color-resist layer to improve the light utilization and reduce material costs.

Specifically, the QD CF substrate further comprises a black matrix 40 disposed on the substrate 10.

Specifically, the QD material in the QD gel is one or more of the II-VI group QD material and I-III-VI group QD material; preferably the QD material in the QD gel is one or more of $ZnCdSe_2$, CdSe, CdTe, $CuInS_2$, and $ZnCuInS_3$.

In summary, the manufacturing method of the present invention uses high power UV light irradiation on the QD material in the QD gel for prolonged period of time to perform selective quenching to obtain a selectively quenched QD layer, i.e., patterning the QD layer without etching process, achieve simplifying the QD CF substrate manufacturing process and reduce production cost. The QD CF substrate of the present invention uses selectively quenched QD layer obtain by UV light irradiation technology to achieve improve the color gamut of display as well as simplifying manufacturing process. Moreover, the QD layer comprises no blue QD material, but uses blue backlight and organic transparent photo-resist layer to improve light utilization efficiency as well as reduce material cost It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A manufacturing method for quantum dot (QD) color filter (CF) substrate, which comprises:
   Step 1: providing a substrate, the substrate comprising: red sub-pixel areas, green sub-pixel areas, and blue sub-pixel areas;
   Step 2: forming a patterned red color-resist layer and a green color-resist layer, and an organic transparent color-resist layer respectively on the corresponding red sub-pixel areas, green sub-pixel areas, and blue sub-pixel areas of the substrate to obtain a CF layer comprising a red color-resist layer, a green color-resist layer and an organic transparent layer;

Step 3: coating a layer of QD gel on the CF substrate, and curing the QD gel;

the QD gel being a heat-curing gel comprising therein a red QD material and a green QD material; and Step 4: providing a mask, the mask comprising an opaque portion corresponding to the red and green sub-pixel areas, and a transparent portion corresponding to the blue sub-pixel areas; using ultraviolet (UV) light to perform irradiation on the portion of the mask corresponding to blue sub-pixel areas for 3-40 hours, so that the irreversible fluorescence quenching occurring for the QD material in the QD gel located on the blue sub-pixel areas under long time UV light irradiation, and the QD material in the QD gel located on red sub-pixel areas and green sub-pixel areas not affected by the UV light due to shielding from the mask, thus, obtaining a selectively quenched QD layer; so as to obtain a QD CF film comprising the substrate, the CF film, and the QD layer; the QD layer comprising: a first QD layer located on the red sub-pixel areas and green sub-pixel areas, and a second QD layer located on the blue sub-pixel areas;

the red QD material and the green QD material in the first QD layer emitting red and green light respectively under the excitement by blue light; and the QD material in the second QD layer not emitting light when excited.

2. The manufacturing method for QD CF substrate as claimed in claim 1, wherein in Step 3, the coating thickness of the QD gel on the CF layer is 0.5-20 um.

3. The manufacturing method for QD CF substrate as claimed in claim 1, wherein the QD material in the QD gel is one or more of the II-VI group QD material and I-III-VI group QD material.

4. The manufacturing method for QD CF substrate as claimed in claim 3, wherein the QD material in the QD gel is one or more of $ZnCdSe_2$, CdSe, CdTe, $CuInS_2$, and $ZnCuInS_3$.

5. The manufacturing method for QD CF substrate as claimed in claim 1, wherein the QD CF substrate is used to a display using blue backlight.

6. A quantum dot (QD) color filter (CF) substrate, which comprises: a substrate, a CF layer disposed on the substrate, and a QD layer disposed on the CF layer;

the substrate comprising: red sub-pixel areas, green sub-pixel areas, and blue sub-pixel areas; the CF layer comprising a red color-resist layer, a green color-resist layer and an organic transparent layer disposed respectively on the corresponding red sub-pixel areas, green sub-pixel areas, and blue sub-pixel areas;

the QD layer comprising: a first QD layer located on the red sub-pixel areas and green sub-pixel areas, and a second QD layer located on the blue sub-pixel areas;

the QD layer being formed by QD gel, and the QD gel being obtained by mixing and curing a gel with a red QD material and a green QD material; the red QD material and the green QD material in the first QD layer emitting red and green light respectively under the excitement by blue light; irreversible fluorescence quenching occurring for the QD material in the second QD layer under long time UV light irradiation for 3-40 hours, and the QD material in the second QD layer not emitting light when excited;

the QD CF substrate being used to a display using blue backlight.

7. The QD CF substrate as claimed in claim 6, wherein the display is an liquid crystal display (LCD), an organic light-emitting diode (OLED) display, or a quantum dot light-emitting diode (QLED) display.

8. The QD CF substrate as claimed in claim 6, wherein the thickness of the QD layer is 0.5-20 um.

9. The QD CF substrate as claimed in claim 6, wherein the QD material in the QD gel is one or more of the II-VI group QD material I-III-VI and group QD material.

10. The QD CF substrate as claimed in claim 9, wherein the QD material in the QD gel is one or more of $ZnCdSe_2$, CdSe, CdTe, $CuInS_2$, and $ZnCuInS_3$.

11. A quantum dot (QD) color filter (CF) substrate, which comprises: a substrate, a CF layer disposed on the substrate, and a QD layer disposed on the CF layer;

the substrate comprising: red sub-pixel areas, green sub-pixel areas, and blue sub-pixel areas; the CF layer comprising a red color-resist layer, a green color-resist layer and an organic transparent layer disposed respectively on the corresponding red sub-pixel areas, green sub-pixel areas, and blue sub-pixel areas;

the QD layer comprising: a first QD layer located on the red sub-pixel areas and green sub-pixel areas, and a second QD layer located on the blue sub-pixel areas;

the QD layer being formed by QD gel, and the QD gel being obtained by mixing and curing a gel with a red QD material and a green QD material; the red QD material and the green QD material in the first QD layer emitting red and green light respectively under the excitement by blue light; irreversible fluorescence quenching occurring for the QD material in the second QD layer under long time UV light irradiation for 3-40 hours, and the QD material in the second QD layer not emitting light when excited;

the QD CF substrate being used to a display using blue backlight;

wherein the display is an liquid crystal display (LCD), an organic light-emitting diode (OLED) display, or a quantum dot light-emitting diode (QLED) display;

wherein the thickness of the QD layer is 0.5-20 um;

wherein the QD material in the QD gel is one or more of the II-VI group QD material and I-III-VI group QD material;

wherein the QD material in the QD gel is one or more of $ZnCdSe_2$, CdSe, CdTe, $CuInS_2$, and $ZnCuInS_3$.

* * * * *